(12) United States Patent
Kuo

(10) Patent No.: US 12,022,739 B2
(45) Date of Patent: Jun. 25, 2024

(54) SEMICONDUCTOR DEVICE AND METHOD FOR FORMING THE SAME

(71) Applicant: UNITED MICROELECTRONICS CORP., Hsin-Chu (TW)

(72) Inventor: Chih-Wei Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/116,277

(22) Filed: Mar. 1, 2023

(65) Prior Publication Data

US 2023/0225216 A1 Jul. 13, 2023

Related U.S. Application Data

(62) Division of application No. 17/121,658, filed on Dec. 14, 2020, now Pat. No. 11,631,805.

(30) Foreign Application Priority Data

Nov. 16, 2020 (CN) .......................... 202011276897.2

(51) Int. Cl.
    *H10N 50/01*    (2023.01)
    *H10B 61/00*    (2023.01)
    *H10N 50/80*    (2023.01)

(52) U.S. Cl.
    CPC ............. *H10N 50/01* (2023.02); *H10B 61/00* (2023.02); *H10N 50/80* (2023.02)

(58) Field of Classification Search
    CPC ............................ H10N 50/01; H01L 21/3212
    See application file for complete search history.

(56) References Cited

U.S. PATENT DOCUMENTS

| 6,590,251 | B2 | 7/2003 | Kang |
| 7,214,609 | B2 | 5/2007 | Jiang |
| 2016/0111325 | A1 | 4/2016 | JangJian |
| 2018/0182809 | A1 | 6/2018 | Liu |
| 2021/0083174 | A1 | 3/2021 | Aggarwal |
| 2021/0098529 | A1 | 4/2021 | Chuang |
| 2021/0134668 | A1* | 5/2021 | Huang .................. H10B 61/22 |

* cited by examiner

*Primary Examiner* — Shih Tsun A Chou
(74) *Attorney, Agent, or Firm* — Winston Hsu

(57) ABSTRACT

A method for forming a semiconductor device includes the steps of providing a substrate having a memory region and a logic region, forming a memory stack structure on the memory region, forming a passivation layer covering a top surface and sidewalls of the memory stack structure, forming a first interlayer dielectric layer on the passivation layer, performing a post-polishing etching back process to remove a portion of the first interlayer dielectric layer and a portion of the passivation layer on the top surface of the memory stack structure, forming a second interlayer dielectric layer on the first interlayer dielectric layer and directly contacting the passivation layer, and forming an upper contact structure through the second interlayer dielectric layer and the passivation layer on the top surface of the memory stack structure to contact the memory stack structure.

10 Claims, 10 Drawing Sheets

SEMICONDUCTOR DEVICE AND METHOD FOR FORMING THE SAME

CROSS REFERENCE TO RELATED APPLICATIONS

This application is a division of U.S. application Ser. No. 17/121,658, filed on Dec. 14, 2020. The content of the application is incorporated herein by reference.

BACKGROUND OF THE INVENTION

1. Field of the Invention

The present invention generally relates to a semiconductor device and method for forming the same. More particularly, the present invention relates to a magnetoresistive random access memory (MRAM) and method for forming the same.

2. Description of the Prior Art

A magnetoresistive random access memory (MRAM) is a kind of non-volatile memory that has drawn a lot of attention in this technology field recently regarding that it may incorporate advantages of other kinds of memories. For example, an MRAM device may have an operation speed comparable to SRAMs, the non-volatile feature and low power consumption comparable to flash, the high integrity and durability comparable to DRAM. More important, the process for forming an MRAM device may be conveniently incorporated into existing semiconductor manufacturing processes.

A typical MRAM cell structure usually comprises a memory stack structure comprising magnetic tunnel junction (MTJ) disposed between the lower and upper interconnecting structures. Unlike conventional memories that store data by electric charge or current flow, an MRAM cell stores data by applying external magnetic fields to control the magnetic polarity and tunneling magnetoresistance (TMR) of the MTJ.

The manufacturing of MRAM devices is still confronted with challenges. For example, the memory stack structure is usually covered by a passivation layer for protection and passivation, and then covered by an interlayer dielectric layer. However, the passivation layer may cause an etching burden during the etching process for forming an upper contact structure for electrically contacting the memory stack structure, and results in problems such as bottom shrinkage or non-opening (due to etching stop) of the upper contact structure. The interconnecting quality between the memory stack structure and the upper contact structure may be influenced, which may cause errors when reading or writing data in the MRAM.

SUMMARY OF THE INVENTION

In light of the above, the present invention is directed to provide a method for forming a semiconductor device, which includes the following steps. First, a substrate having a memory region and a logic region is provided. Subsequently, a memory stack structure is formed on the memory region of the substrate. A passivation layer is then formed on the substrate and covers a top surface and sidewalls of the memory stack structure. After that, a first interlayer dielectric layer is formed on the passivation layer. A post-polishing etching back process is then performed to remove a portion of the first interlayer dielectric layer and a portion of the passivation layer on the top surface of the memory stack structure. Afterward, a second interlayer dielectric layer is formed on the first interlayer dielectric layer and directly contacts the passivation layer. Following, an upper contact structure is formed and penetrates through the second interlayer dielectric layer and the passivation layer on the top surface of the memory stack structure to contact the memory stack structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
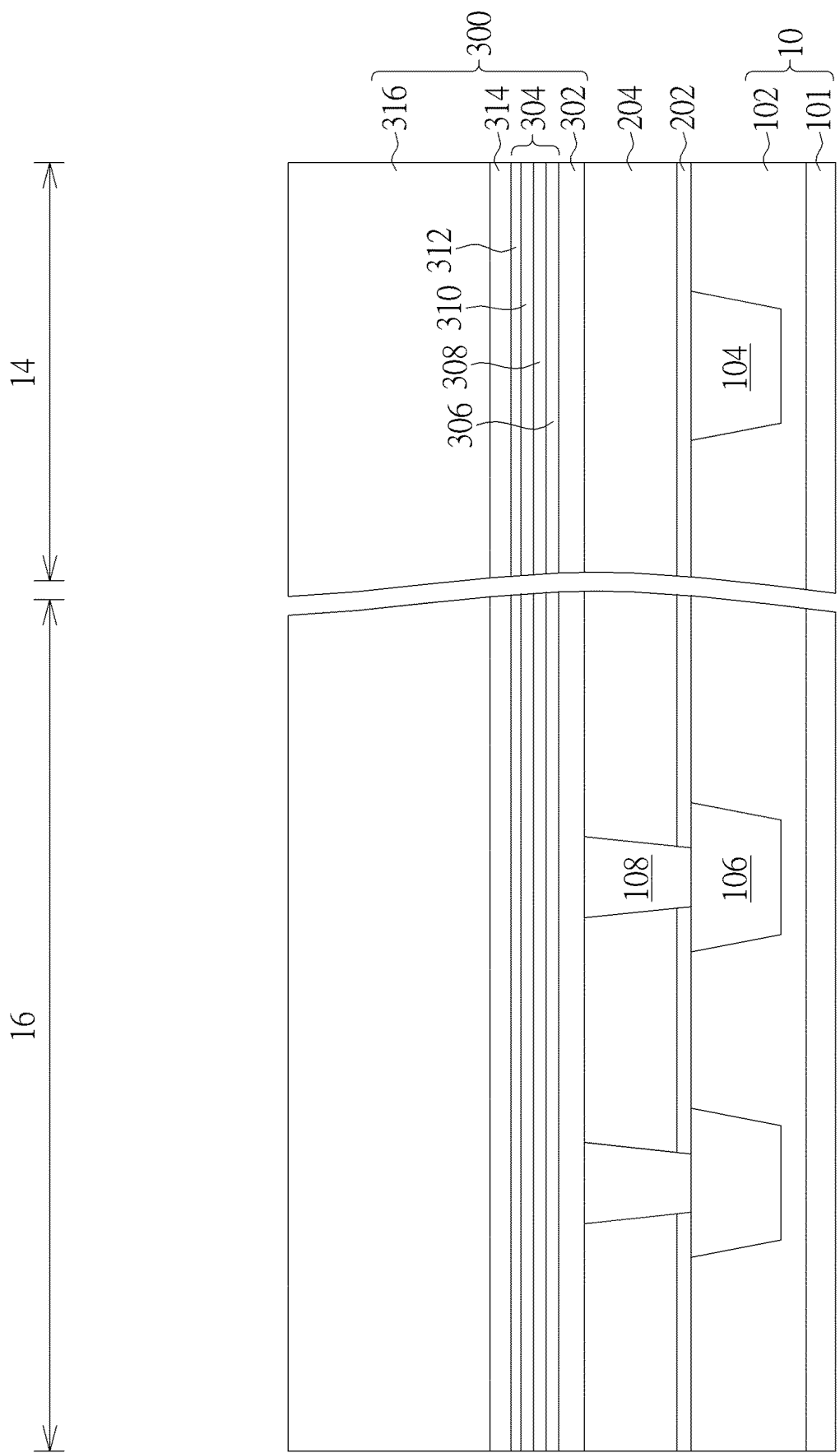
FIG. 1 to FIG. 10 are schematic cross-sectional diagrams illustrating the steps of a method of forming a semiconductor device according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments. These embodiments are described in sufficient detail to enable those skilled in the art to practice the invention. Other embodiments may be utilized and that structural, logical and electrical changes may be made without departing from the spirit and scope of the present invention.

The semiconductor structure illustrated in the embodiment in the following description may be a magnetic random access memory (MRAM). It should be understood that the present invention may be applied to other semiconductor devices including components integrally manufactured with back-end-on-line (BEOL) process, such as ferroelectric random access memory (FRAM), phase-change random access memory (PRAM), or resistive random access memory (RRAM), but is not limited thereto.

Please refer to FIG. 1 to FIG. 10, which are schematic cross-sectional diagrams illustrating the steps of a method of forming a semiconductor device according to an embodiment of the present invention. As shown in FIG. 1, first, a substrate 10 is provided. The substrate 10 includes a logic region 14 and a memory region 16. Subsequently, an etching stop layer 202 and a dielectric material layer 204 are successively formed on the substrate 10. Afterward, a memory stack layer 300 is formed on the dielectric material layer 204.

The substrate 10 may include a multi-layered structure. For example, the substrate 10 may include a semiconductor substrate 101 and an interlayer dielectric layer 102 on the semiconductor substrate 101. The semiconductor substrate 101 may be a silicon substrate, a silicon-on-insulator (SOI) substrate, or a Group III-V semiconductor substrate, but is not limited thereto. The semiconductor substrate 101 may include active components such as metal-oxide semiconductor (MOS) transistors, passive components, conductive layers, and dielectric layers such as isolation structures and interlayer dielectric (ILD) layers formed therein. For the sake of simplicity, those components and structural layers are not shown in the diagram.

The interlayer dielectric layer 102 may include dielectric materials such as silicon oxide ($SiO_2$) or low-k dielectric materials such as fluorinated silica glass (FSG), silicon oxycarbide (SiCOH), spin-on-glass, porous low-k dielectric material, organic dielectric polymers, or a combination thereof, but is not limited thereto.

The interlayer dielectric layer 102 may include interconnecting structures formed therein. For example, a lower interconnecting structure 104 formed in the logic region 14 of the interlayer dielectric layer 102, and a lower interconnecting structure 106 formed in the memory region 16 of the interlayer dielectric layer 102. The lower interconnecting structure 104 and the lower interconnecting structure 106 may include metal materials, such as tungsten (W), copper (Cu), aluminum (Al), or other suitable metal materials, but are not limited thereto. According to an embodiment, the lower interconnecting structure 104 and the lower interconnecting structure 106 respectively include copper (Cu).

The etching stop layer 202 is disclosed between the interlayer dielectric layer 102 and the dielectric material layer 204. The etching stop layer 202 may include dielectric materials such as silicon nitride (SiN), silicon carbon nitride (SiCN), silicon oxynitride (SiON), or nitride doped silicon carbide (NDC), but is not limited thereto. The dielectric material layer 204 may include silicon oxide ($SiO_2$) or low-k dielectric materials.

A plurality of contact plugs 108 may be formed in the memory region 16 and through the dielectric material layer 204 and the etching stop layer 202 to directly contact and electrically coupled to the lower interconnecting structure 106 in the memory region 16. The contact plugs 108 may include metal materials, such as tungsten (W), copper (Cu), aluminum (Al), or other suitable metal materials, but are not limited thereto. According to an embodiment, the contact plugs 108 include tungsten (W).

The memory stack layer 300 may include, from bottom to top, a bottom electrode layer 302, a magnetic tunneling junction (MTJ) stack layer 304, a capping layer 314 and a top electrode layer 316. The bottom electrode layer 302 and the top electrode layer 316 respectively include conductive materials, such as titanium (Ti), tantalum (Ta), titanium nitride (TiN), tantalum nitride (TaN), or a combination thereof, but are not limited thereto. The bottom electrode layer 302 and the top electrode layer 316 may include the same or different conductive materials. The MTJ stack layer 304 may comprise multiple layers including, from bottom to top, a pinning layer 306, a pinned layer 308, a tunneling layer 310 and a free layer 312. The pinning layer 306 may comprise anti-ferromagnetic (AFM) material such as PtMn, IrMn, PtIr or the like, but is not limited thereto. The pinning layer 306 is used to pin or fix nearby ferromagnetic layers to a particular magnetic polarity. The pinned layer 308 and the free layer 312 may comprise the same or different ferromagnetic materials such as Fe, Co, Ni, FeNi, FeCo, CoNi, FeB, FePt, FePd, CoFeB, or the like, but are not limited thereto. The magnetic polarity of the pinned layer 308 is pinned (anti-ferromagnetic coupled) by the pinning layer 306, while the magnetic polarity of the free layer 312 may be changed by an external magnetic field. The tunneling layer 310 is sandwiched between the pinned layer 308 and the free layer 312 and may comprise insulating materials such as MgO, $Al_2O_3$, NiO, GdO, $Ta_2O_5$, $MoO_2$, $TiO_2$, tungsten oxide ($WO_2$), or a combination thereof, but is not limited thereto. The pinning layer 306, the pinned layer 308, the tunneling layer 310 and the free layer 312 may respectively comprise single or multiple layers having a thickness ranges from several angstroms (Å) to dozens of nanometers (nm). The capping layer 314 may comprise metals or metal oxides, such as aluminum (Al), magnesium (Mg), tantalum (Ta), ruthenium (Ru), tungsten dioxide ($WO_2$), nickel oxide (NiO), magnesium oxide (MgO), aluminum oxide ($Al_2O_3$), tantalum oxide ($Ta_2O_5$), molybdenum dioxide ($MoO_2$), titanium oxide ($TiO_2$), gadolinium oxide (GdO), or manganese oxide (MnO), or a combination thereof, but is not limited thereto.

Figure 2:
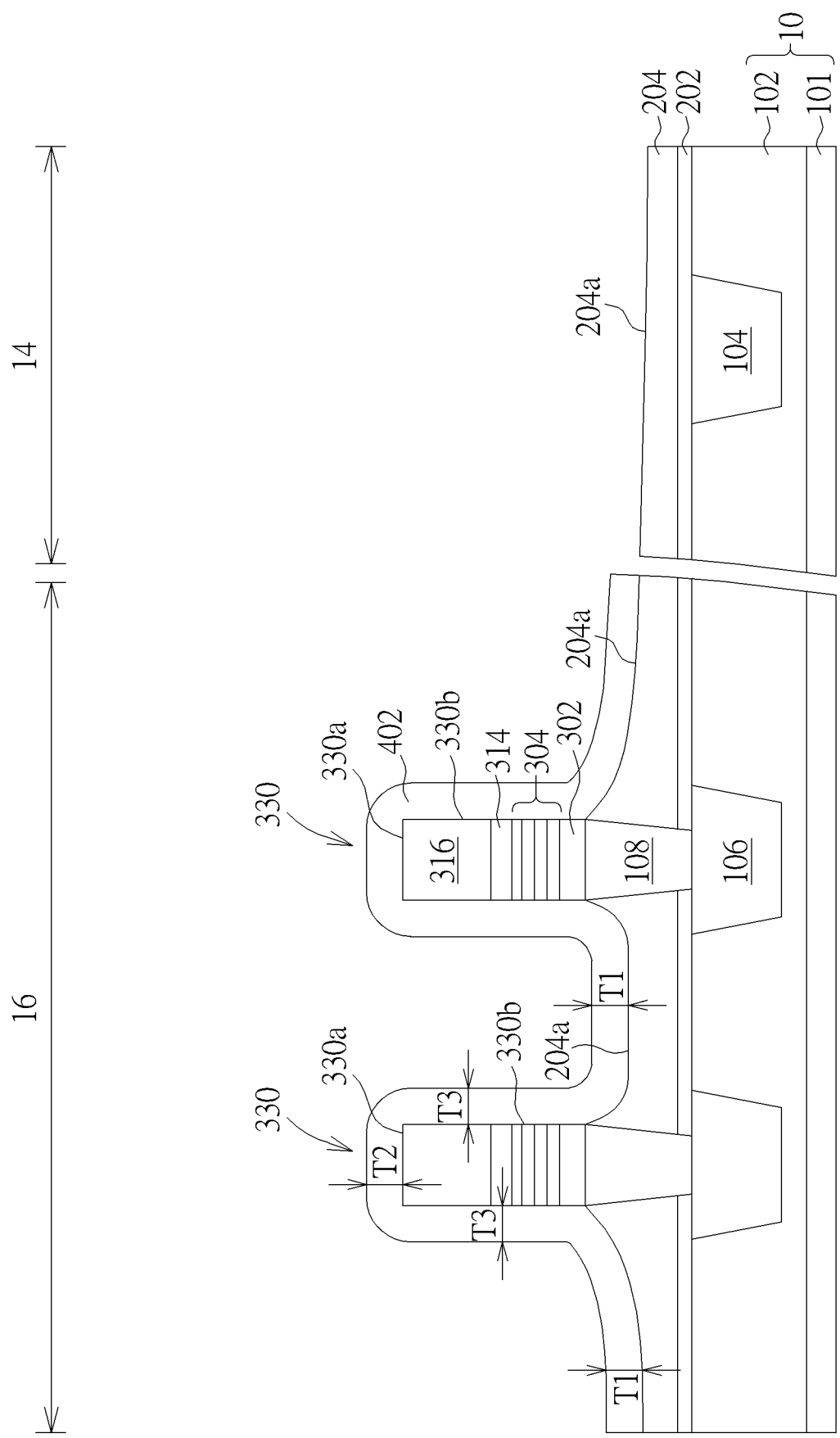

Please refer to FIG. 2. Subsequently, a patterning process is performed to pattern the memory stack layer 300 to form a plurality of memory stack structures 330 on the memory region 16 substrate 10 and also remove the memory stack layer 300 on the logic region 14 of the substrate 10.

According to an embodiment of the present invention, the patterning process for forming the memory stack structures 330 may include the following steps. First, a patterned hard mask layer (not shown), such as a patterned silicon oxide layer or a patterned silicon nitride layer, may be formed on the top electrode layer 316. After that, a first stage of etching, such as a reactive ion etching (RIE) process, using the patterned hard mask layer as an etching mask may be performed to etch the top electrode layer 316, thereby transferring the pattern of the patterned hard mask layer to the top electrode layer 316. Afterward, a second stage of etching, such as an ion beam etching (IBE) process, using the patterned top electrode layer 316 as an etching mask may be performed to etch the capping layer 314, the MTJ stack layer 304 and the bottom electrode layer 302, thereby transferring the pattern of the patterned top electrode layer 316 to the capping layer 314, the MTJ stack layer 304 and the bottom electrode layer 302. As a result, the memory stack structures 330 as shown in FIG. 2 are obtained. According to an embodiment of the present invention, the dielectric material layer 204 exposed from the memory stack structures 330 on the memory device region 16 and the dielectric material layer 204 on the logic device region 14 may be over-etched by the second stage of etching (the IBE process) to ensure the unnecessary memory stack layer 300 being removed. Accordingly, the dielectric material layer 204 may have a recessed top surface 204a after the patterning process.

Please continue to refer to FIG. 2. Subsequently, a passivation layer 402 may be formed on the substrate 10 and conformally cover a top surface and sidewalls of each memory stack structure 330 and the recessed top surface 204a of the dielectric material layer 204. According to an embodiment of the present invention, optionally, a removing process such as a photo-lithography etching process may be performed to remove the passivation layer 402 on the logic region 14 of the substrate 10, and the surface of the dielectric material layer 204 on the logic region 14 may be exposed.

The passivation layer 402 may be formed by chemical vapor deposition (CVD) and may include an insulating material such as silicon nitride (SiN), silicon carbon nitride (SiCN), silicon oxynitride (SiON), or a combination thereof, but is not limited thereto. According to an embodiment of the present invention, the passivation layer 402 includes silicon nitride (SiN). According to an embodiment, the passivation layer 402 is formed in-situ after the second stage of etching, i.e. the IBE process, to prevent the magnetic tunneling junction (MTJ) stack layer 304 exposed from the sidewalls 330b of the memory stack structures 330 from being oxidized or absorbing contaminations.

As shown in FIG. 2. A portion of the passivation layer 402 covering the recessed top surface 204a of the dielectric material layer 204 may have a thickness T1. A portion of the passivation layer 402 covering the top surface 330a of the memory stack structure 330 may have a thickness T2. A portion of the passivation layer 402 covering the sidewalls 330b of the memory stack structure 330 may have a thickness T3. According to an embodiment of the present invention, the thickness T1 and the thickness T2 may approximately be equal to each other, and the thickness T3 is smaller than the thickness T1 and the thickness T2. For example, the thickness T3 may be between 60% and 80% of the thickness T1 or of the thickness T2. According to an embodiment of the present invention, the thickness T1 and the thickness T2 may be between 300 Å and 360 Å, and the thickness T3 may be between 180 Å and 220 Å.

Figure 3:
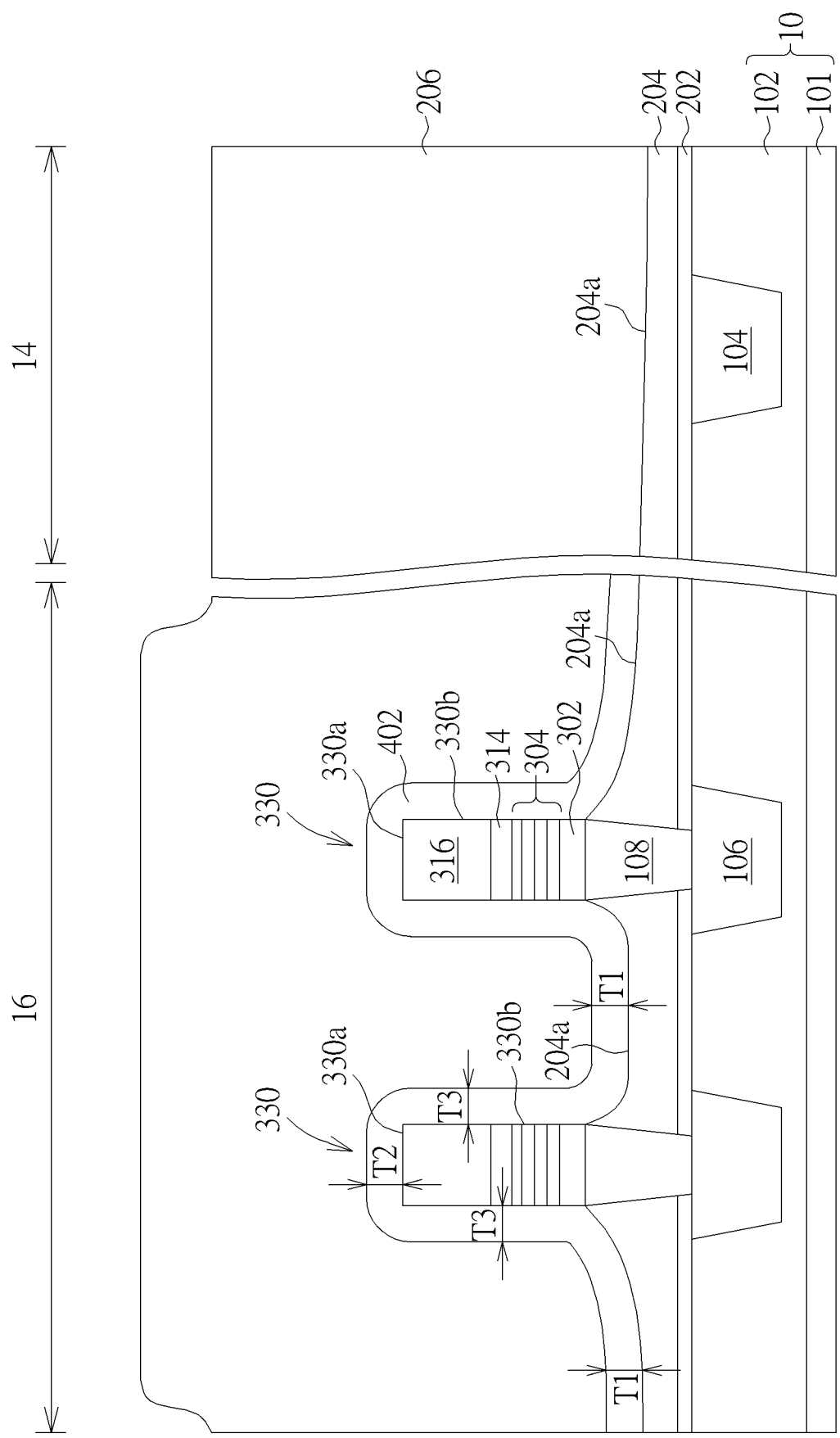

Please refer to FIG. 3. Subsequently, a dielectric material layer 206 is formed on the substrate 10 in a blanket manner. The dielectric material layer 206 completely covers the logic region 14 and the memory region 16 of the substrate 10 and fills the space between the memory stack structures 330. The memory stack structures 330 make the surface of the dielectric material layer 206 on the memory device region 16 of the substrate 10 be higher than the surface of the dielectric material layer 206 on logic device region 14 of the substrate 10. The dielectric material layer 206 may include dielectric materials such as silicon oxide ($SiO_2$) or low-k dielectric materials such as fluorinated silica glass (FSG), silicon oxycarbide (SiCOH), spin on glass, porous low-k dielectric material, organic dielectric polymers, or a combination thereof, but is not limited thereto.

Figure 4:
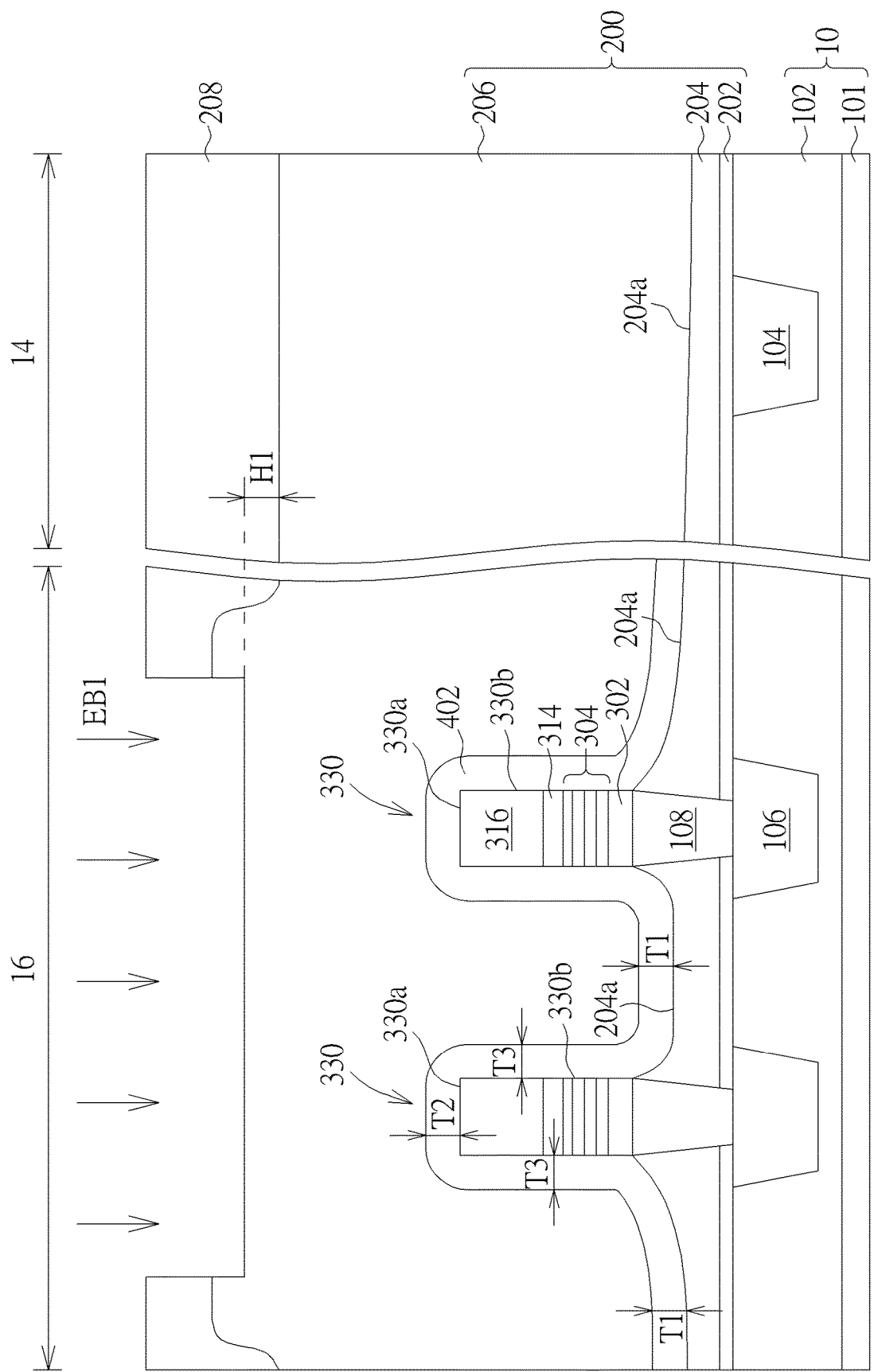

Please refer to FIG. 4. Subsequently, a mask layer 208 (such as a photoresist layer) is formed on the dielectric material layer 206. The mask layer 208 is then patterned to form an opening exposing a portion of the dielectric material layer 206 on the memory region 16 of the substrate 10. Following, a pre-polishing etching back process EB1 (such as a dry etching process) using the mask layer 208 as an etching mask is performed to etch away a portion of the dielectric material layer 206 from the opening of the mask layer 208 until a surface of the dielectric material layer 206 on the memory region 16 is higher than a surface of the dielectric material layer 206 on the logic region 14 by a height H1. According to an embodiment of the present invention, a range of the height H1 may be between 200 Å and 300 Å, but is not limited thereto.

Figure 5:
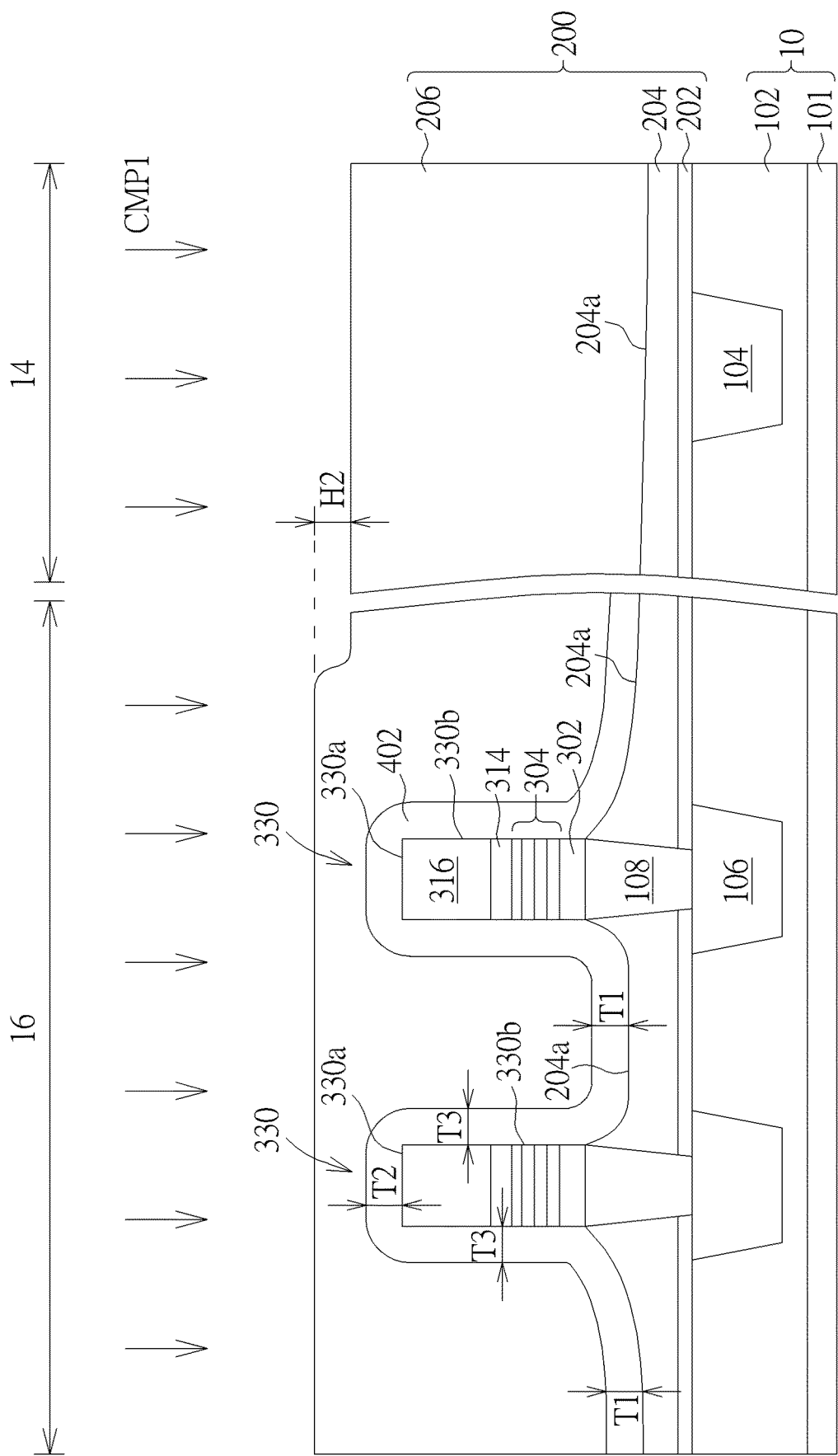

Please refer to FIG. 5. Subsequently, after removing the mask layer 208, a polishing process CMP1 is performed to planarize the dielectric material layer 206. According to an embodiment of the present invention, due to the loading effect of the polishing process CMP1, a surface of the dielectric material layer 206 on the memory region 16 may still be higher than a surface of the dielectric material layer 206 on the logic region 14 by a height H2 after the polishing process CMP1. The height H2 may be approximately equal to or slightly smaller than the height H1. For example, the height H2 may be between 200 Å and 300 Å, or between 160 Å and 200 Å, but is not limited thereto. After the polishing process CMP1, the etching stop layer 202, the dielectric material layer 204 and the dielectric material layer 206 collectively form a first interlayer dielectric layer 200 of the semiconductor device of the present invention. It should be noted that at this process stage, the passivation layer 402 on the memory stack structure 330 is still covered by the dielectric material layer 206 and is not exposed.

Figure 6:
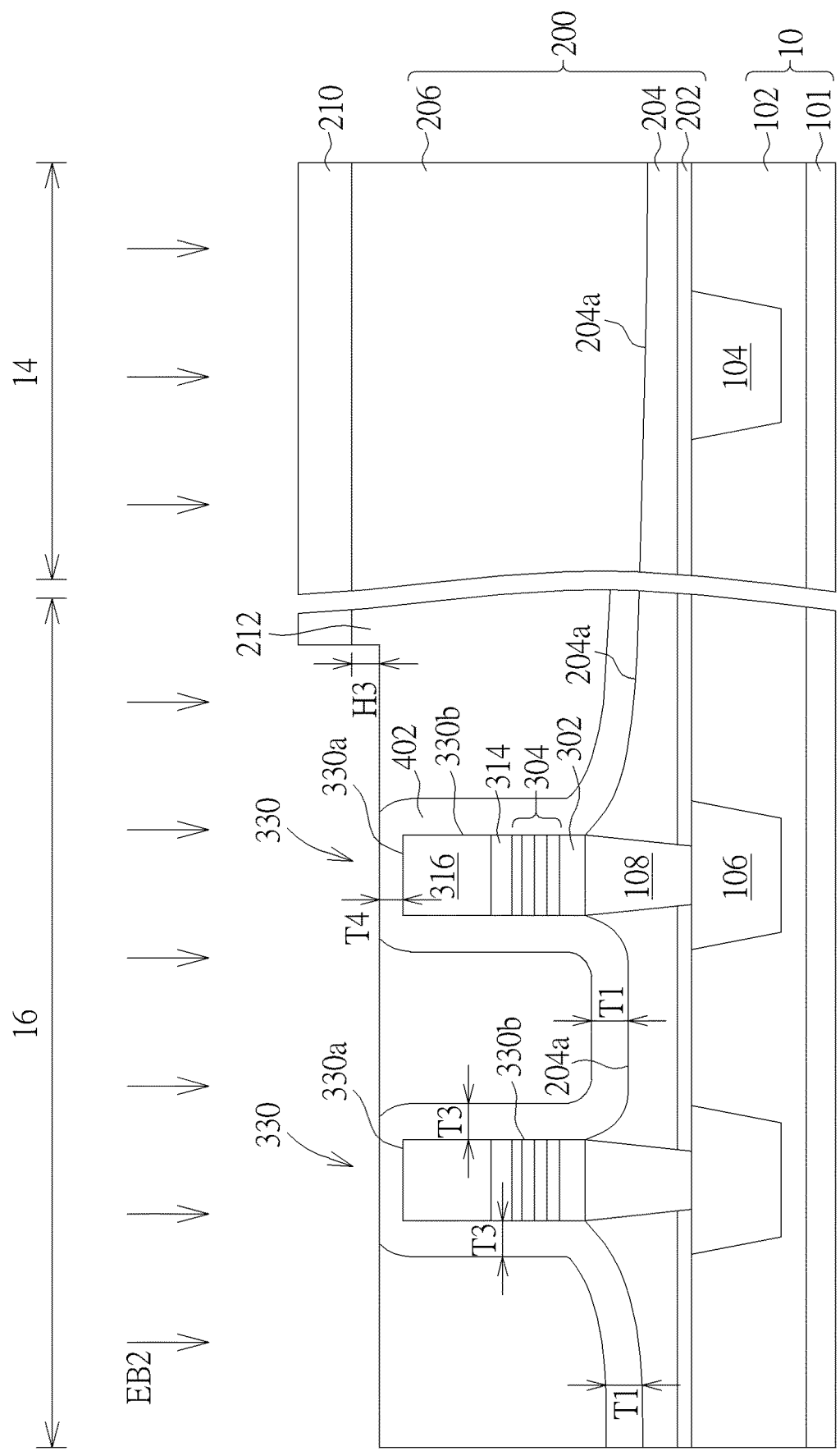

Please refer to FIG. 6. Subsequently, a mask layer 210 (such as a photoresist layer) is formed on the dielectric material layer 206. The mask layer 210 is then patterned to form an opening exposing a portion of the dielectric material layer 206 on the memory region 16 of the substrate 10. Following, a post-polishing etching back process EB2 (such as a dry etching process) using the mask layer 210 as an etching mask is performed to etch away a portion of the dielectric material layer 206 from the opening of the mask layer 210 to expose the passivation layer 402 on the top surface 330a of the memory stack structure 330. The post-polishing etching back process EB2 continues to etch away a portion of the passivation layer 402 without exposing any portion of the memory stack structure 330. As shown in FIG. 6, after the post-polishing etching back process EB2, the passivation layer 402 on the top surface 330a of the memory stack structure 330 may have a thickness T4. According to an embodiment of the present invention, preferably, the thickness T4 may be between 30% and 50% of the thickness of the etching stop layer 602 of the second interlayer dielectric layer 600 formed in a later process step (shown in FIG. 10). For example, the thickness T4 may be between 60 Å and 100 Å, but is not limited thereto.

Please continue to refer to FIG. 6. After the post-polishing etching back process EB2, a surface of the dielectric material layer 206 on the memory region 16 of the substrate 10 may be lower than a surface of the dielectric material layer 206 on the logic region 14 of the substrate 10, thereby forming a step portion 212 of the dielectric material layer 206 having a step-height H3 near the boundary between the logic region 14 and the memory region 16. According to an embodiment of the present invention, the step-height H3 may be between 100 Å and 150 Å, but is not limited thereto.

Figure 7:
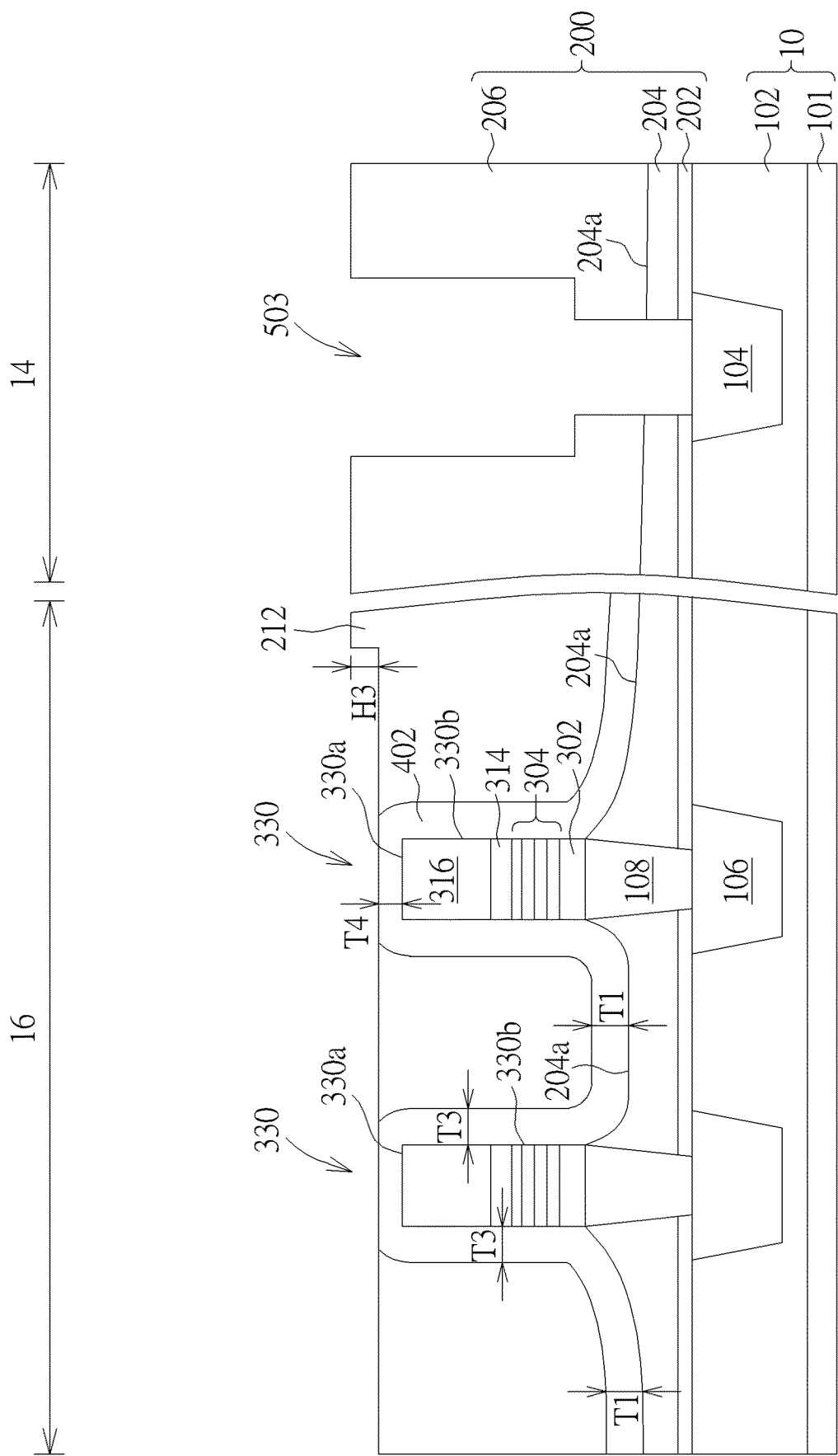
Figure 8:
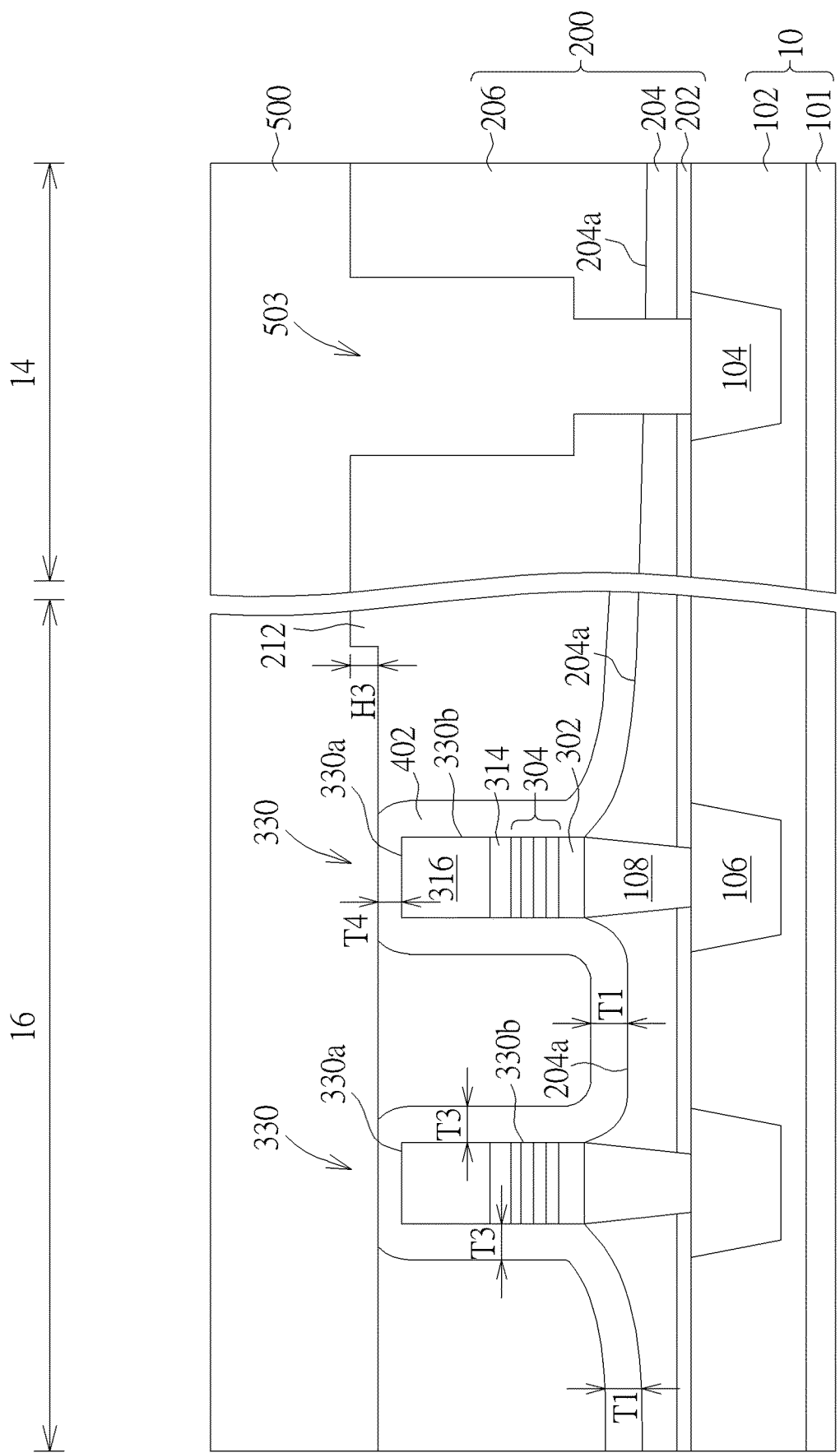

Please refer to FIG. 7 and FIG. 8. Subsequently, after removing the mask layer 210, a dual damascene process may be performed to form a first interconnecting structure 510 in the first interlayer dielectric layer 200. In detail, a trench 503 may be formed in the logic region 14 and through the dielectric material layer 206, the dielectric material layer 204 and the etching stop layer 202 of the first interlayer dielectric layer 200 to expose a surface of the lower interconnecting structure 104. After that, a conductive layer 500 is formed on the first interlayer dielectric layer 200 and filling up the trench 503. The conductive layer 500 may include metals, such as tungsten (W), copper (Cu), aluminum (Al), or other suitable metal materials, but is not limited thereto. According to an embodiment of the present invention, the conductive layer 500 may include copper (Cu). As shown in FIG. 8, the conductive layer 500 may directly contact the passivation layer 402 on the top surface 330a of the memory stack structure 330. According to an embodiment of the present invention, the conductive layer 500 may include a barrier layer (not shown) interfacing the dielectric material layer 206, the dielectric material layer 204, the etching stop layer 202 and the lower interconnecting structure 104.

Figure 9:
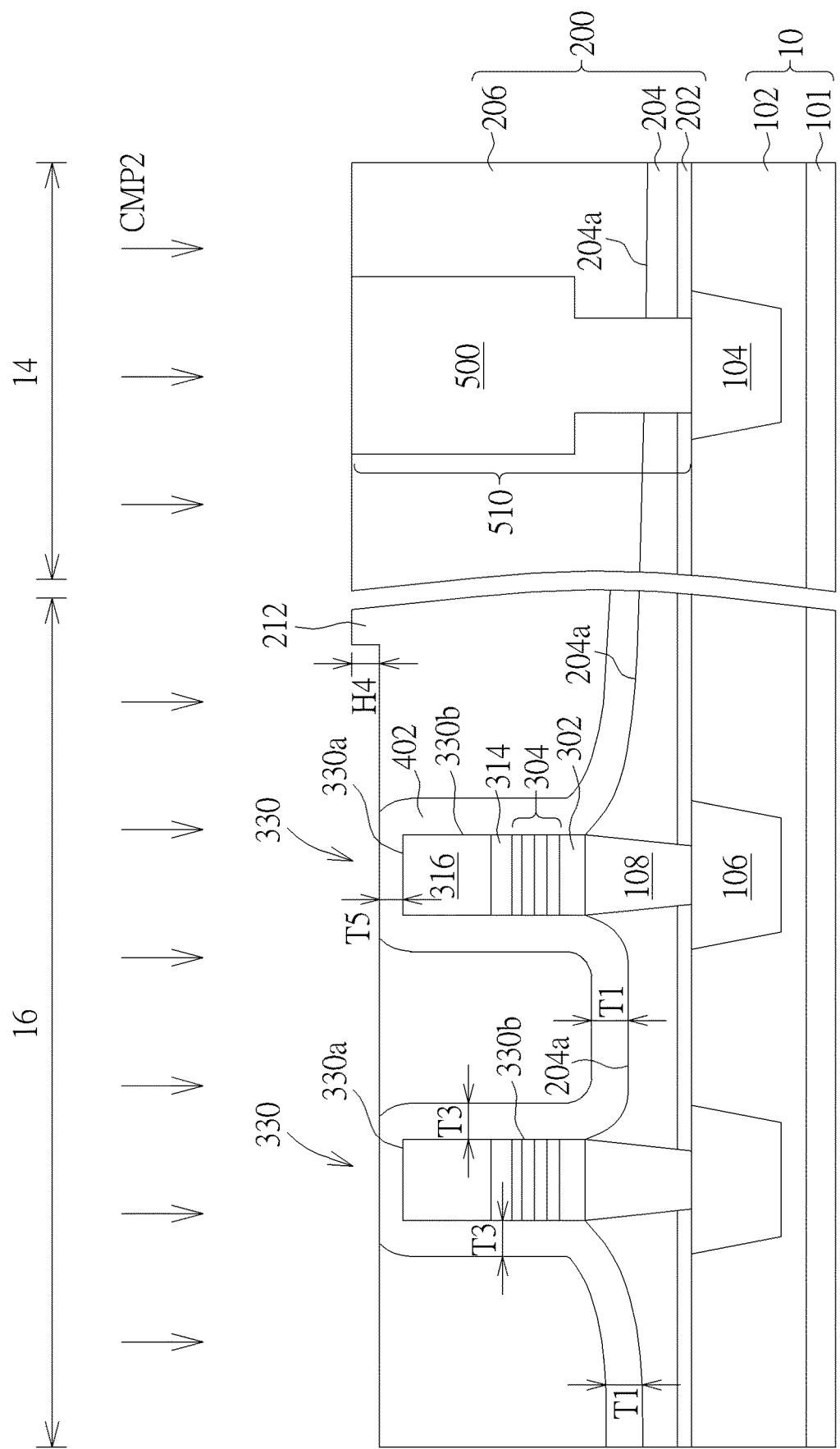

As shown in FIG. 9, a metal polishing process CMP2 is then performed to remove the conductive layer 500 outside the trench 503 until a surface of the dielectric material layer 206 is exposed. The conductive layer 500 remaining filling in the trench 503 becomes the first interconnecting structure 510. The first interconnecting structure 510 directly contacts and is electrically coupled to the lower interconnecting structure 104 in the logic region 14 of the substrate 10.

It should be noted that, by using a polishing slurry that has high removal rate for the conductive layer 500 and small removal rate for the dielectric material layer 206 and the passivation layer 402 (high selectivity between the conductive layer 500 and the dielectric material layer 206 and the passivation layer 402) during the metal polishing process CMP2, the metal polishing process CMP2 may be well controlled to stop on the dielectric material layer 206 and the passivation layer 402. In this way, the metal polishing process CMP2 will not significantly reduce the thicknesses of the dielectric material layer 206 and the passivation layer 402, and will not significantly influence the through-substrate (or through wafer) uniformity of the dielectric material layer 206 and the passivation layer 402. According to an embodiment of the present invention, after the metal polishing process CMP2, a step portion 212 of the dielectric material layer 206 having a step-height H4 may appear near the boundary between the logic region 14 and the memory region 16. The step-height H4 may be approximately equal to or smaller than the step-height H3. For example, the step-height H4 may be between 100 Å and 150 Å, but is not limited thereto. After the metal polishing process CMP2, the passivation layer 402 on the top surface 330a of the memory stack structures 330 may have a thickness T5. The thickness T5 may be approximately equal to or smaller than the thickness T4. For example, the thickness T5 may be between 60 Å and 100 Å, but is not limited thereto.

Figure 10:
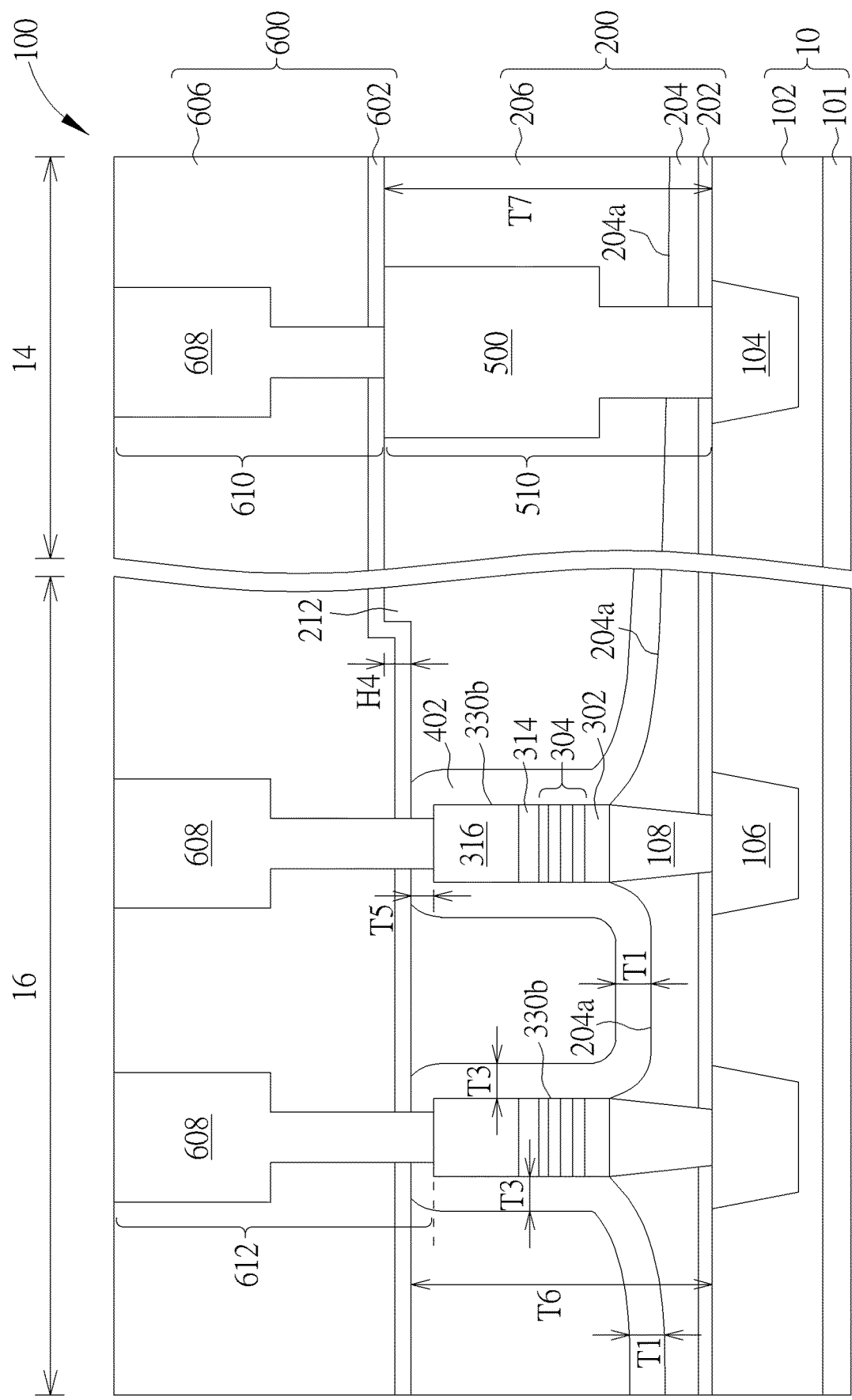

Please refer to FIG. 10. Subsequently, a second interlayer dielectric layer 600 is formed on the first interlayer dielectric layer 200. The second interlayer dielectric layer 600 may include an etching stop layer 602 and a dielectric material layer 606 disposed on the etching stop layer 602. Following, a second interconnecting structure 610 and an upper contact structure 612 are formed in the second interlayer dielectric layer 600 on the logic region 14 and the memory region 16, respectively.

As shown in FIG. 10. The etching stop layer 602 directly contacts the passivation layer 402, the dielectric material layer 206 and the conductive layer 500, and conformally covers the step portion 212 of the dielectric material layer 206 near the boundary between the logic region 14 and the memory region 16. The etching stop layer 602 may include dielectric materials such as silicon nitride (SiN), silicon carbon nitride (SiCN), silicon oxynitride (SiON), or nitride doped silicon carbide (NDC), but is not limited thereto. According to an embodiment of the present invention, the etching stop layer 602 and the etching stop layer 202 include a same material, such as nitride doped silicon carbide (NDC). According to an embodiment of the present invention, a thickness of the etching stop layer 602 may be between 180 Å and 220 Å.

The dielectric material layer 606 may include dielectric materials such as silicon oxide ($SiO_2$) or low-k dielectric materials such as fluorinated silica glass (FSG), silicon oxycarbide (SiCOH), spin-on-glass, porous low-k dielectric material, organic dielectric polymers, or a combination thereof, but is not limited thereto. According to an embodiment of the present invention, the dielectric material layer 606 and the dielectric material layer 206 may include a same material, such as at least one of the low-k dielectric materials illustrated above.

The upper contact structure 612 penetrates through the second interlayer dielectric layer 600 on the memory region 16 and the passivation layer 402 on the top surface 330a of the memory stack structure 330 to contact the top electrode layer 316 of the memory stack structure 330. The second interconnecting structure 610 penetrates through the second interlayer dielectric layer 600 on the logic region 14 to contact the first interconnecting structure 510. According to an embodiment of the present invention, the upper contact structure 612 and the second interconnecting structure 610 may be formed concurrently in the second interlayer dielectric layer 600 by, for example, a dual damascene process. The upper contact structure 612 and the second interconnecting structure 610 may respectively include a conductive layer 608. The conductive layer 608 may include metals, such as tungsten (W), copper (Cu), aluminum (Al), or other suitable metal materials, but is not limited thereto. According to an embodiment of the present invention, the conductive layer 608 may include copper (Cu). According to an embodiment of the present invention, the conductive layer 608 of the upper contact structure 612 may include a barrier layer (not shown) interfacing the dielectric material layer 606, the etching stop layer 602, the passivation layer 402, and the top electrode layer 316 of the memory stack structure 330. The conductive layer 608 of the second interconnecting structure 610 may include a barrier layer (not shown) interfacing the dielectric material layer 606, the etching stop layer 602, and the conductive layer 500 of the first interconnecting structure 510.

Please continue to refer to FIG. 10. According to one embodiment of the present invention, a semiconductor device 100 is provided. The semiconductor device 100 includes a substrate 10 having a logic region 14 and a memory region 16, and a first interlayer dielectric layer 200 on the substrate 10. A portion of the first interlayer dielectric layer 200 on the memory region 16 has a thickness T6, and another portion of the first interlayer dielectric layer 200 on the logic region 14 has a thickness T7. The thickness T6 is smaller than the thickness T7, thereby forming a step portion 212 of the dielectric material layer 206 near the boundary between the logic region 14 and the memory region 16. According to an embodiment of the present invention, the thickness T6 and the thickness T7 may be different by approximately between 100 Å and 150 Å. The step-height H4 of the step portion 212 may be between 100 Å and 150 Å. The second interlayer dielectric layer 600 is disposed on the first interlayer dielectric layer 200 and covers the step portion 212 of the dielectric material layer 206. At least a memory stack structure 330 is disposed in the first interlayer dielectric layer 200 on the memory region 16 of the substrate 10. A first interconnecting structure 510 is disposed in the first interlayer dielectric layer 200 on the logic region 14. A height of the memory stack structure 330 is smaller than a height of the first interconnecting structure 510. The passivation layer 402 is provided to cover the top surface 330a and sidewalls 330b of the memory stack structures 330, wherein the second interlayer dielectric layer 600 directly contacts the passivation layer 402, and a portion of the passivation layer 402 is sandwiched between the top surface 330a of the memory stack structures 330 and the second interlayer dielectric layer 600. The portion of the passivation layer 402 sandwiched between the top surface 330a of the memory stack structures 330 and the second interlayer dielectric layer 600 has the thickness T5, and the thickness T5 is smaller than the thickness T3 of another portion of the passivation layer 402 on the sidewalls 330b of the memory stack structures 330. According to an embodiment of the present invention, the thickness T5 may be between 60 Å and 100 Å, and the thickness T3 may be between 180 Å and 220 Å. The upper contact structure 612 penetrates through the second interlayer dielectric layer 600 and the passivation layer 402 on the top surface 330a of the memory stack structure 330 to contact the memory stack structure 330.

In conclusion, one feature of the present invention is that, by performing a post-polishing etching back process to remove the interlayer dielectric layer and a portion of the passivation layer on the top surface of the memory stack structure, the thickness of the material that the bottom portion of the upper contact structure needs to penetrate through and the thickness of the material that the bottom portion of the second interconnecting structure needs to penetrate through may be closer, which is beneficial for integrally forming the upper contact structure and the second interconnecting structure. Furthermore, it is also possible to control the post-polishing etching back process to yield the passivation layer with better thickness uniformity on the top surface of the memory stack structure. In this way, the difficulty caused by the thickness variation of the first interlayer dielectric layer after the polishing process to the etching process of forming the upper contact structure and the second interconnecting structure may be reduced. Overall, when the upper contact structure and the second interconnecting structure are integrally formed at the same time, the problems such as bottom shrinkage or non-opening of the upper contact structure may be reduced, and a better product yield may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate having a memory region and a logic region;
   forming a memory stack structure on the memory region;
   forming a passivation layer covering a top surface and sidewalls of the memory stack structure;
   forming a first interlayer dielectric layer on the passivation layer;
   performing a post-polishing etching back process to remove a portion of the first interlayer dielectric layer and a portion of the passivation layer on the top surface of the memory stack structure;
   forming a second interlayer dielectric layer on the first interlayer dielectric layer and directly contacting the passivation layer; and
   forming an upper contact structure through the second interlayer dielectric layer and the passivation layer on the top surface of the memory stack structure to contact the memory stack structure.

2. The method for forming a semiconductor device according to claim 1, wherein the post-polishing etching back process comprises:
   forming a mask layer on the first interlayer dielectric layer and exposing the first interlayer dielectric layer on the memory region of the substrate;
   using the mask layer as an etching mask to etch the first interlayer dielectric layer and the passivation layer; and
   removing the mask layer.

3. The method for forming a semiconductor device according to claim 1, wherein the step of forming a first interlayer dielectric layer comprises:
   forming a dielectric material layer on the passivation layer;
   performing a pre-polishing etching back process to remove a portion of the dielectric material layer on the memory region of the substrate; and
   after the pre-polishing etching back process, performing a polishing process to planarize the dielectric material layer.

4. The method for forming a semiconductor device according to claim 3, wherein a surface of the dielectric material layer on the memory region of the substrate is higher than a surface of the dielectric material layer on the logic region by between 200 Å and 300 Å after the pre-polishing etching back process.

5. The method for forming a semiconductor device according to claim 3, wherein a surface of the dielectric material layer on the memory region of the substrate is higher than a surface of the dielectric material layer on the logic region by between 200 Å and 300 Å after the polishing process.

6. The method for forming a semiconductor device according to claim 1, wherein after the post-polishing etching back process, a thickness of the passivation layer on the top surface of the memory stack structure is smaller than a thickness of the passivation layer on the sidewalls of the memory stack structure.

7. The method for forming a semiconductor device according to claim 6, wherein the thickness of the passivation layer on the top surface of the memory stack structure is between 60 Å and 100 Å, and the thickness of the passivation layer on the sidewalls of the memory stack structure is between 180 Å and 220 Å.

8. The method for forming a semiconductor device according to claim 1, further comprising removing the passivation layer on the logic region of the substrate.

9. The method for forming a semiconductor device according to claim 1, further comprising:
   forming a trench in the first interlayer dielectric layer on the logic region of the substrate;
   forming a conductive layer on the first interlayer dielectric layer and filling the trench, wherein the conductive layer directly contacts the passivation layer on the top surface of the memory stack structure; and
   performing a metal polishing process to removing the conductive layer outside the trench, thereby forming a first interconnecting structure in the trench.

10. The method for forming a semiconductor device according to claim 9, further comprising:
    forming a second interconnecting structure through the second interlayer dielectric layer to contact the first interconnecting structure.

* * * * *